United States Patent
Chen et al.

(10) Patent No.: US 9,634,247 B2
(45) Date of Patent: *Apr. 25, 2017

(54) COMPLEMENTARY METAL OXIDE HETEROJUNCTION MEMORY DEVICES AND METHODS RELATED THERETO

(71) Applicant: 4D-S, Ltd., Perth, WA (US)

(72) Inventors: Dongmin Chen, Saratoga, CA (US);
Lee Cleveland, Santa Clara, CA (US);
Seshubabu Desu, Vestal, NY (US);
Kurt Pfluger, Monte Sereno, CA (US);
Jean Yang-Scharlotta, Glendale, CA (US)

(73) Assignee: 4D-S LTD., Perth (AU)

( * ) Notice: Subject to any disclaimer, the term of this patent is extended or adjusted under 35 U.S.C. 154(b) by 85 days.

This patent is subject to a terminal disclaimer.

(21) Appl. No.: 13/831,935

(22) Filed: Mar. 15, 2013

(65) Prior Publication Data

US 2014/0117298 A1   May 1, 2014

Related U.S. Application Data

(60) Provisional application No. 61/719,078, filed on Oct. 26, 2012.

(51) Int. Cl.
*H01L 45/00* (2006.01)

(52) U.S. Cl.
CPC ............ *H01L 45/145* (2013.01); *H01L 45/08* (2013.01); *H01L 45/1233* (2013.01); *H01L 45/147* (2013.01); *H01L 45/1608* (2013.01)

(58) Field of Classification Search
None
See application file for complete search history.

(56) References Cited

U.S. PATENT DOCUMENTS

2010/0321991 A1* 12/2010 Kostylev et al. ............ 365/163
2011/0006275 A1*  1/2011 Roelofs et al. ................ 257/2

* cited by examiner

*Primary Examiner* — Marvin Payen
(74) *Attorney, Agent, or Firm* — Kilpatrick Townsend & Stockton LLP

(57) ABSTRACT

A resistive memory device is disclosed. The memory device comprises one or more metal oxide layers. An oxygen vacancy or ion concentrations of the one or more metal oxide layer is controlled in the formation and the operation of the memory device to provide robust memory operation.

13 Claims, 20 Drawing Sheets

Back-to-back switching resistor

Identify the Tri-state 10 state vs. 01 state (destructive read, need to reinstall the state after read)

By creating asymmetry on the HRS of CW and CCW switching resistor, it is possible to read the 10, and 01 nondestructively, as no need to reset from the HRS to LRS.

ND METHODS RELATED THERETO

COMPLEMENTARY METAL OXIDE HETEROJUNCTION MEMORY DEVICES AND METHODS RELATED THERETO

CROSS-REFERENCES TO RELATED APPLICATIONS

This application claims the benefit under 35 USC §119(e) to U.S. Provisional Patent Application No. 61/719,078 filed on Oct. 26, 2012, the contents of which are incorporated by reference herein in its entirety for all purposes.

This application is related to U.S. patent application Ser. No. 13/396,404 filed Feb. 14, 2012, which claims priority under 35 U.S.C. §371 to PCT Application No. PCT/US2010/045667, filed on Aug. 16, 2010, which in turn claims priority under 35 U.S.C. §119(e) to U.S. Provisional Application No. 61/234,183, filed on Aug. 14, 2009. This application is also related to U.S. Provisional Application No. 61/666,933 filed on Jul. 2, 2012. The disclosures of the above mentioned applications are all incorporated by reference herein in their entirety for all purposes.

BACKGROUND

As Moore's Law has been predicted, the capacity of memory cells on silicon for the past 15-20 years has effectively doubled each year. Moore's Law roughly states that every year the amount of devices such as transistor gates or memory cells on a silicon wafer will double, thus doubling the capacity of the typical chip while the price will essentially stay the same. As the devices continue to shrink, device technology is starting to reach a barrier known as the quantum limit, that is, they are actually approaching atomic dimensions, so the cells cannot get any smaller.

As a response to the limitations of directly shrinking transistor gates and memory cells, the "More than Moore's Law" movement has taken hold to push beyond simply shrinking cell size to increase the chip functionality. The focus is directed instead on methods to improve system integration as the means to increase the functionality and decrease the size of the final electronics product. For example, system-on-package methods combine individual chips with different functionalities such as microprocessor, microcontroller, sensor, memory, and others in one package rather than connecting them over a printed-circuit board with large discreet passive components. The system-on-package method further addresses sizes of discreet passive components—such as resistors, capacitors, inductors, antennas, filters, and switches by using micrometer-scale thin-film versions of discrete components. Another example is system-on-chip, which seeks to build entire signal-processing systems or subsystems with diverse functions on a chip of silicon—a system-on-chip, or SOC. Such a chip may include digital logic and memory for computation, analog and RF communications circuitry, and other circuit functions. Usually, these dissimilar circuits not only operate at different voltages but also require different processing steps during manufacture. Such differences have traditionally been a barrier to integrating such diverse circuitry on a single chip. For example, the processes for manufacturing microprocessors and flash nonvolatile memory chips are so different that the cost of manufacturing the two types of devices on the same chips is the same or more as the cost of manufacturing the two chips separately. Thus a different type of memory device while can be more easily and economically integrated with digital logic, analog, and RF circuitry is needed.

Separately, disk drives have been a type of information storage which provided a significant portion peak capacity. The storage density provided by disk drives have been cheaper than semiconductor memory devices at least partially due to the way disk drives store and read individual bits of information in individual domains (magnetic transition sites) with an external probe. This method of storing and reading the information does not require individual circuit connections for each bit of storage location, thus requiring significantly less overhead than storage in semiconductor memory which does require the individual circuit connections. The individually connected semiconductor memory such as Flash memory, however, is preferable to disk drives in terms of resistance to shock as it has no moving parts which may be damaged by movement and shock.

As semiconductor device scaling passes 90 nanometer feature size, or node to 45 and 25 nanometer nodes, the semiconductor memory density are beginning to reach similar density and cost as disk drive storage. Multiple bit storage per device, where a multiple of data bits may be stored in a single cell by a division of ranges, has also been employed to increase density and reduce cost.

Semiconductor memories such as flash memory of the floating gate or charge trapping types suffer from other issues due to scaling. As the size of the devices become smaller, variations of a few electrons begin to manifest as large variations in device characteristics such as current, write speed, and erase speed. Such large variations further require increased write, read, and erase time to reach the same distribution ranges for operation and reduce the supportable dynamic ranges for multiple bit storage.

Yet one more concern for traditional flash type of semiconductor memory scaling is the reduction of the number of write/erase cycle the cell will tolerate before it permanently fails. Prior to the substantial reduction in cell size, the typical flash memory write/erase cycle tolerance rating is in the range of 1,000,000, however, as the feature size reduces in size, write/erase cycle tolerance rating has diminished to the range of 3,000 cycles. This reduction of write/erase cycle tolerance limits the applications for the memory. For example, for a memory device to also function in current SRAM and DRAM applications, such memory must tolerate data exchange at much higher repetition rates, typically several times per microsecond, resulting in 1,000,000 or more cycles.

Accordingly, what is desired are a memory device, system and method which overcome the above-identified problems. The memory device, system and method should be easily implemented, cost effective and adaptable to existing storage applications. The system and method should also be simple to integrate with other ICs in terms of processing and operating voltages. The present disclosure addresses such a need.

SUMMARY

The present disclosure relates generally to memory devices, and more particularly to a resistive memory device that includes heterojunction metal oxide which has the property of one or more of the complementary memory behavior described herein.

Some embodiments of the present invention disclose a memory device. The memory device comprises a first metal layer and a first metal oxide layer coupled to the first metal layer. The device also includes a second metal oxide layer coupled to the first metal oxide layer and a second metal layer coupled to the second metal oxide layer.

Other embodiments of the memory device of the present disclosure comprises a first metal layer and a first metal oxide layer coupled to the first metal layer. The device also includes a barrier layer coupled to the first metal oxide layer, a second metal oxide layer coupled to the barrier layer, and a second metal layer coupled to the second metal oxide layer.

Further embodiments of the method of forming the memory device of the present disclosure comprise providing a substrate, depositing a first metal layer, depositing a first metal oxide, forming a second metal oxide layer, and depositing a second metal layer.

The following detailed description, together with the accompanying drawings will provide a better understanding of the nature and advantages of the present invention.

BRIEF DESCRIPTION OF THE DRAWINGS

FIGS. 1A and 1B illustrates two embodiments of such memory devices.

FIG. 7C' illustrates a metal oxide 1 deposited on to the metal oxide 2, and an inert metal is provided on top of the metal oxide 2, according to another embodiment of the present disclosure.

DETAILED DESCRIPTION OF SPECIFIC EMBODIMENTS

Figure 1:
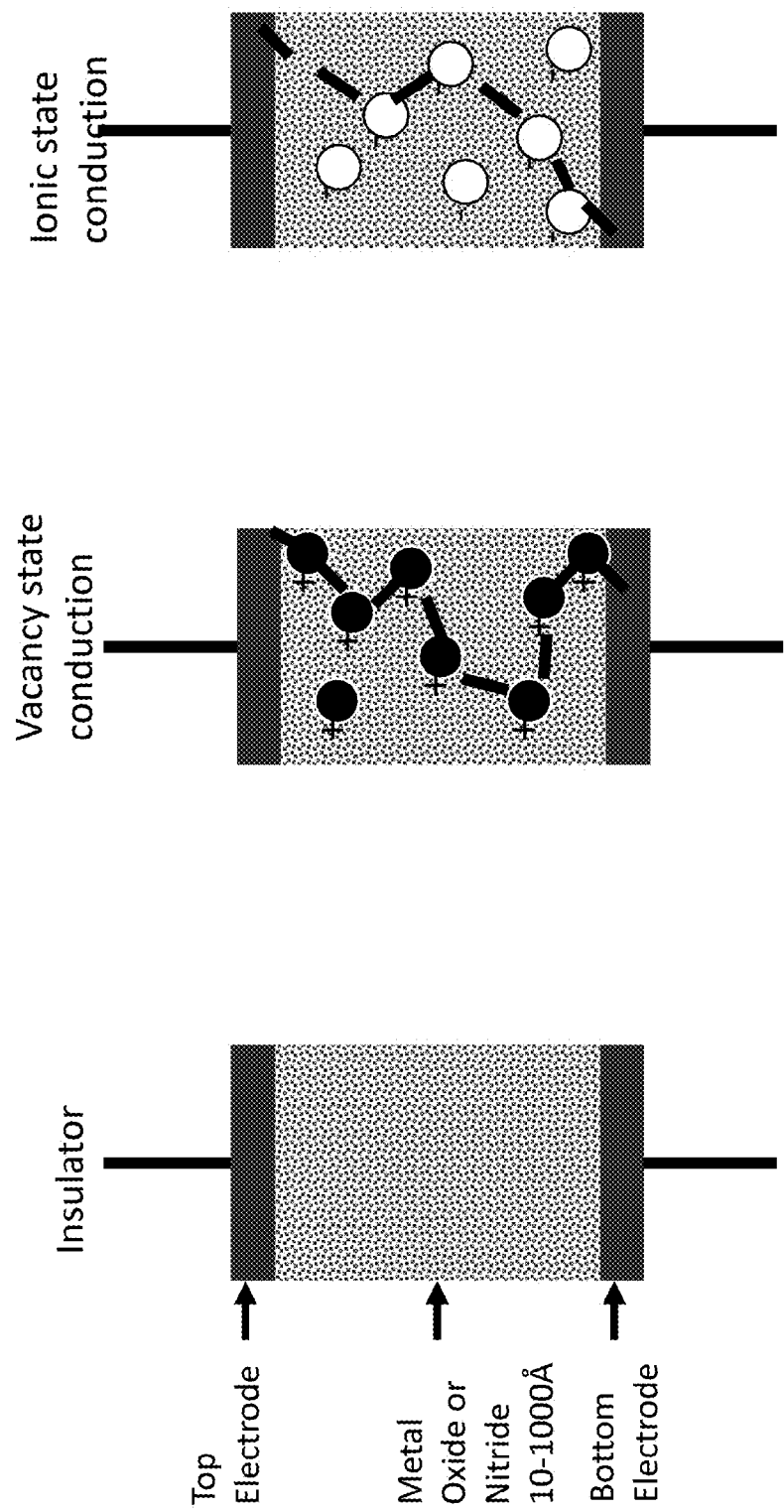
FIG. 1 illustrates three types of memory devices in accordance with an embodiment of the present disclosure.

The present disclosure relates generally to memory devices, and more particularly to a memory device that includes heterojunction metal oxide or metal nitride material which behave in one or more of the complementary memory behavior described herein. The following description is presented to enable one of ordinary skill in the art to make and use the disclosed device, system and method and is provided in the context of a patent application and its requirements. Various modifications to the preferred embodiments and the generic principles and features described herein will be readily apparent to those skilled in the art. Thus, the present disclosure is not intended to be limited to the embodiments shown, but is to be accorded the widest scope consistent with the principles and features described herein.

The present disclosure is directed to a memory device, methods of forming the device, and systems comprising the device. The memory device can be utilized in a variety of applications from a free standing nonvolatile memory to an embedded device in a variety of applications. These applications include but are not limited to embedded memory used in a wide range of SOC (system on chip) or system on package, switches in programmable or configurable ASIC, solid state drive used in computers and servers, memory used in mobile electronics like camera, cell phone, electronic pad, and build in memory in micro devices such as RF chips, mobile sensors and many others.

The memory device comprises a first metal layer and a first metal oxide layer coupled to the first metal layer. The memory device may include an optional barrier layer coupled to the first metal oxide layer. The memory device includes a second metal oxide layer coupled to the optional barrier layer or the first metal oxide layer. The memory device also includes a second metal layer coupled to the second metal oxide layer. These metal layers, optional barrier layers, and metal oxide layers can be of a variety of types and their use will be within the spirit and scope of the present disclosure.

For example, although the first metal oxide layer is described as a metal oxide layer comprising oxygen ions or vacancies in many of the embodiments disclosed herein, the first metal oxide layer may be a metal nitride layer or a metal oxynitride layer comprising nitrogen and/or oxygen ions or vacancies. Similarly, although the second metal oxide layer is described as a metal oxide layer it also may be a metal nitride layer or a metal oxynitride layer.

For a further example, many of the embodiments disclosed herein will include PCMO as one of the metal oxide layers. It is well understood by one of ordinary skill in the art that the present disclosure should not be limited to this metal oxide layer, metal nitride layer or any other layer disclosed herein.

The key elements are that the formation of the first metal oxide layer has a Gibbs free energy that is lower than the Gibbs free energy for the formation of the second metal oxide layer and that the oxygen content of the first metal oxide layer and the second metal oxide layers are each controlled by the film formation process such that a controlled relative oxygen content of the first and second metal oxides is reached to enable a vacancy conduction type of memory device or an ionic conduction type of memory device.

In addition, there may be a barrier layer of wider band gap material than the first metal oxide, the second metal oxide or both. The difference in the oxygen diffusion constant will form a barrier to prevent oxygen ions or vacancies from moving between the first metal oxide and the second metal oxide. This barrier can serve to improve the retention of a resistance memory state even after the electric field is removed. The resistance memory state is typically formed by an externally applied electric field which drives the oxygen ions or vacancies from either the first metal oxide or the second metal oxide into the other metal oxide layer.

Referring now to FIG. 1, shown herein are three type of metal oxide or metal nitride based devices, each device comprising at least a top electrode, a metal oxide or metal nitride or metal oxynitride layer of typically 10-1000 Angstrom thickness, and a bottom electrode. The device behavior is described herein with respect a metal oxide layer but is applicable to metal nitride or metal oxynitrides as well.

In the case where the metal oxide is stoichiometric, the metal oxide typically behaves as an insulator and will not conduct electron. When the metal oxide is very thin, on the order of a few to a few 10ths of Angstroms, direct tunneling and FN tunneling may occur.

If an oxygen-deficient (sub-stoichiometric) metal oxide is present in the device as shown in the center device, the oxygen-deficient oxide may contain vacancies that may form defect states in the middle of the band gap. When the mean distance of the oxygen vacancy is within the range of electron path length of the metal oxide, an oxygen vacancy based conduction path can be established by percolation which may allow electron conduction.

For the situation where an oxygen-rich (super-stoichiometric) metal oxide is present, the excess oxygen ions can form defect states in the middle of the band gap as well. When the mean distance of the oxygen ion is within the percolation path distance threshold, an oxygen ion based conduction path can be estabed and allow electron conduction through the metal oxide layer.

Figure 2:
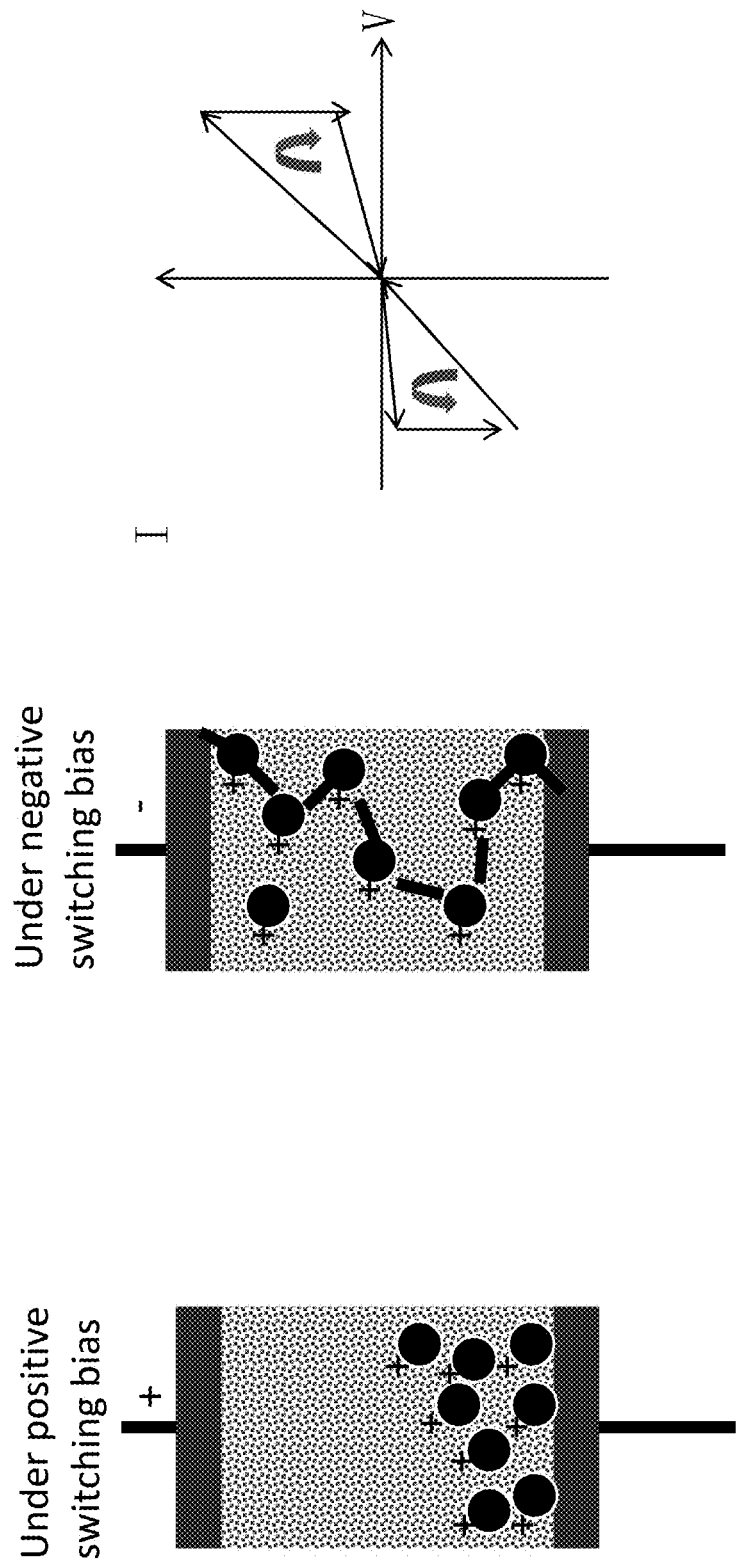
FIG. 2 illustrates the operation of a vacancy state conduction type of metal oxide device under positive and negative switching biases and the resulting IV shapes.

Referring now to FIG. 2, under a positive switching bias condition when a positive bias is applied to the top electrode, oxygen vacancies can move toward the bottom electrode as illustrated in the left illustration of FIG. 2. This vacancy movement can disrupt the conduction path and result in a higher resistance state for the device.

When a negative bias is applied to the top electrode, the oxygen vacancies can be pulled toward the top electrode. This vacancy movement can establish or reestablish the conduction patch. It is noted that the bias field applied to the top electrode driving the vacancy movement will stop driving the vacancy movement once electron conduction begins. Thus, the process is self limiting as long as the applied bias does not exceed a breakdown voltage beyond which irreparable damage to the oxide bonds occur. This is also known as the break down limit. Finally, the hysteresis illustration at the right hand side of FIG. 2 shows that this vacancy conduction type of device tends to exhibit a clockwise IV loop at V>0 and a counter clockwise loop at V<0.

Figure 3:
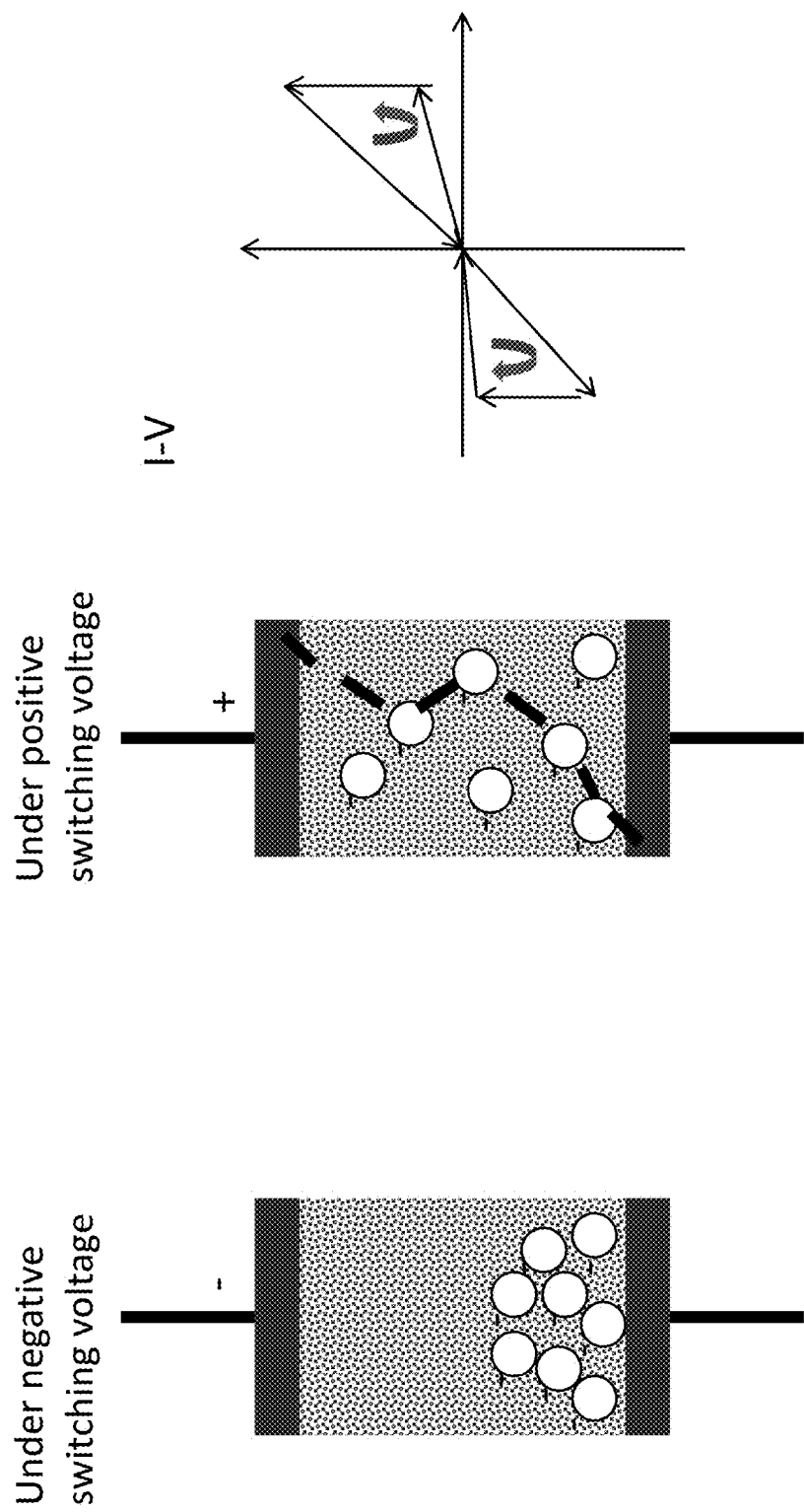
FIG. 3 illustrates the operation of an ionic state conduction type of metal oxide device under negative and positive switching biases and the resulting IV shapes.

Referring now to FIG. 3, under a negative switching bias condition when a negative bias is applied to the top electrode, oxygen ions can move toward the bottom electrode as illustrated in the left illustration of FIG. 3. This ionic movement can disrupt the conduction path and result in a higher resistance state for the device.

When a positive bias is applied to the top electrode, the oxygen ions can be pulled toward the top electrode. This ionic movement can establish or reestablish the conduction patch. It is noted that the bias field applied to the top electrode driving the ionic movement will stop driving the ionic movement once electron conduction begins. Thus, the process is self limiting as long as the applied bias does not exceed a breakdown voltage beyond which irreparable damage to the oxide bonds occur. This is also known as the break down limit. Finally, the hysteresis illustration at the right hand side of FIG. 3 shows that this ionic conduction type of device tends to exhibit a counter-clockwise IV loop at V>0 and a clockwise loop at V<0.

Figure 4:
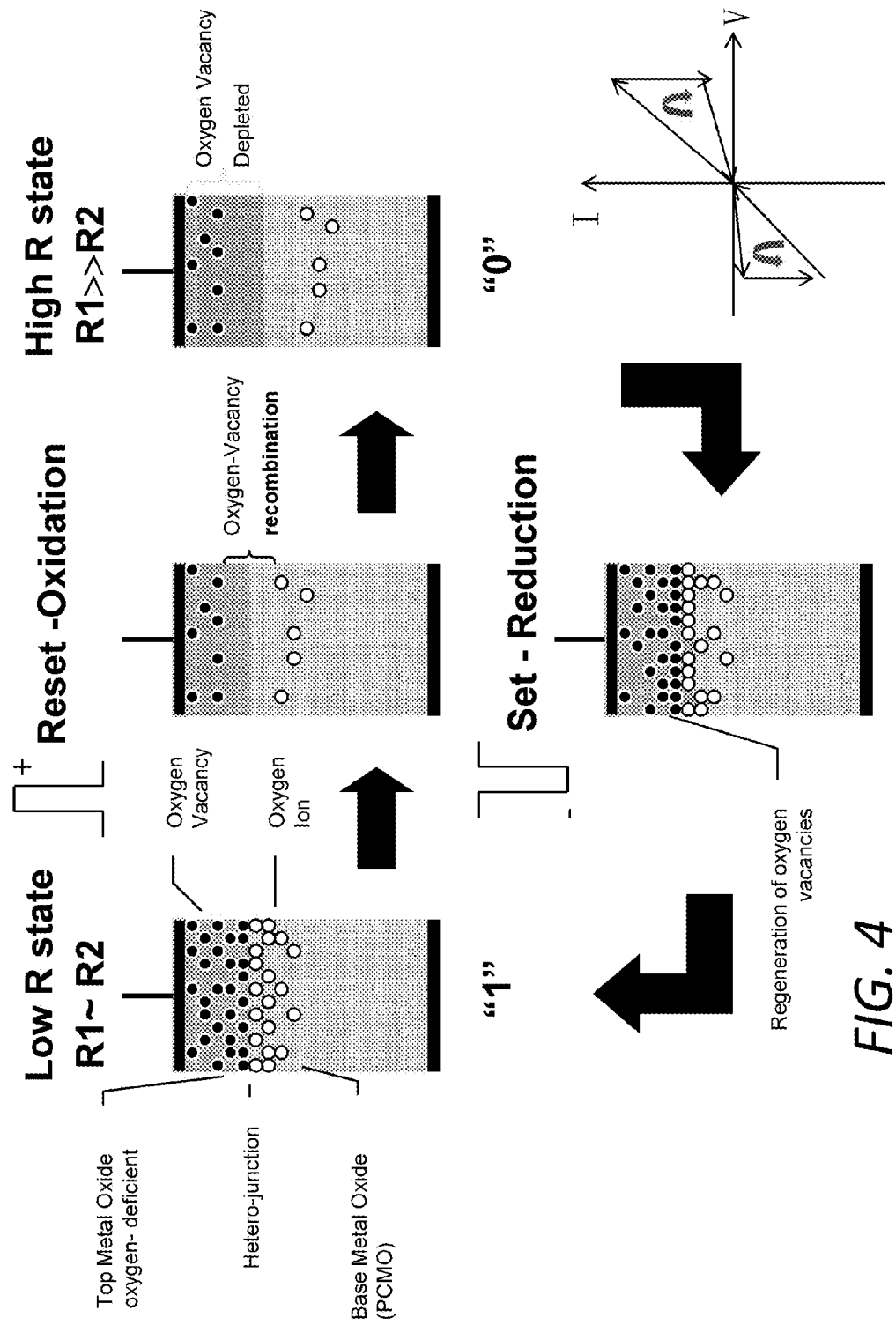
FIG. 4 illustrates details of the operation of a vacancy state conduction type of metal oxide device

Referring now to FIG. 4, shown herein is an embodiment of a vacancy type of metal oxide heterojunction memory device. The device comprising a top electrode, a top metal oxide which is oxygen-deficient, a base metal oxide, and a bottom electrode. A heterojunction is formed by the interface of the top metal oxide and the base metal oxide. The base metal oxide may be thicker than the top metal oxide.

A low resistance state is shown where a first resistance (R1) of the top metal oxide is similar in magnitude as a second resistance (R2) of the base metal oxide. This low resistance state can also be known as the "1" state of the memory device. At the low resistance state, the top metal oxide is shown comprising oxygen vacancy and the base metal oxide is shown comprising oxygen ions.

A positive bias can be applied to the top electrode in a reset operation which may cause recombination of the oxygen vacancy from the top metal oxide and the oxygen ions from the base metal oxide to recombine at the heterojunction result in a depletion of oxygen vacancies in the top metal oxide as previously shown in FIG. 2 left illustration characterized by higher resistance. This reset operation may result in a high resistance state for the memory device where the a first resistance (R1) of the top metal oxide is greater than a second resistance (R2) of the base metal oxide. This high resistance state can be also known as the "0" state of the memory device.

A negative bias can be applied to the top electrode in a set operation which may cause the regeneration of the oxygen vacancies at the heterojunction to populate the top metal oxide and return the memory device to a low resistance state as is also shown in the middle illustration of FIG. 2.

Figure 5:
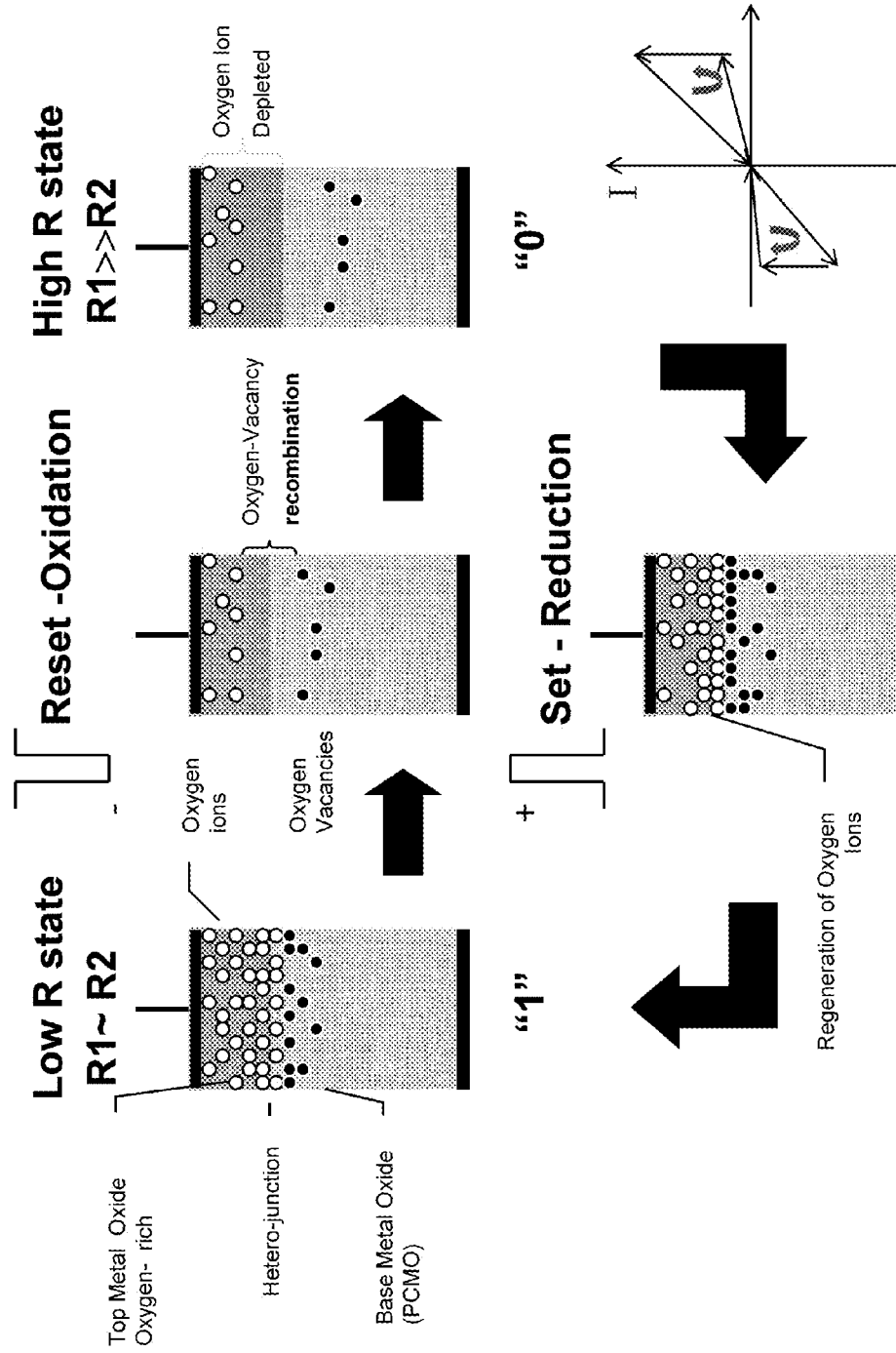
FIG. 5 illustrates details of the operation of an ionic state conduction type of metal oxide device

Referring now to FIG. 5, shown herein is an embodiment of an ionic type of metal oxide heterojunction memory device. The device comprising a top electrode, a top metal oxide which is oxygen-rich, a base metal oxide, and a bottom electrode. A heterojunction is formed by the interface of the top metal oxide and the base metal oxide. The base metal oxide may be thicker than the top metal oxide.

A low resistance state is shown where a first resistance (R1) of the top metal oxide is similar in magnitude as a second resistance (R2) of the base metal oxide. This low resistance state can also be known as the "1" state of the memory device. At the low resistance state, the top metal oxide is shown comprising oxygen ions and the base metal oxide is shown comprising oxygen vacancies.

A negative bias can be applied to the top electrode in a reset operation which may cause recombination of the oxygen ions from the top metal oxide and the oxygen vacancies from the base metal oxide to recombine at the heterojunction result in a depletion of oxygen ions in the top metal oxide as previously shown in FIG. 3 left illustration resulting in higher resistance. This reset operation may result in a high resistance state for the memory device where the a first resistance (R1) of the top metal oxide is greater than a second resistance (R2) of the base metal oxide. This high resistance state can be also known as the "0" state of the memory device.

A positive bias can be applied to the top electrode in a set operation which may cause the regeneration of the oxygen ions at the heterojunction to populate the top metal oxide and return the memory device to a low resistance state as is previous shown by the middle illustration of FIG. 3.

Figure 6A:
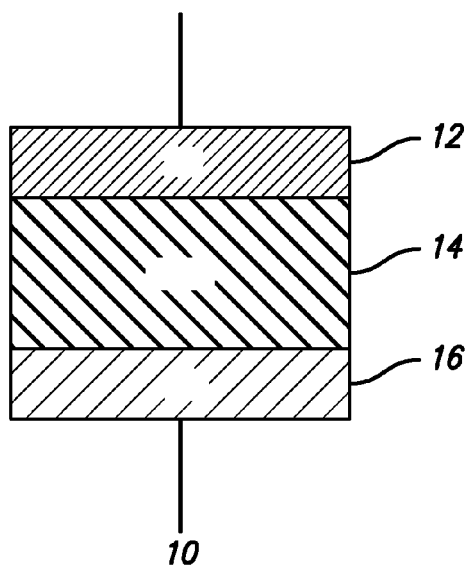
FIGS. 6A, 6B illustrates two embodiments of such memory device and FIG. 6C show experimental hysteresis loops for vacancy type and ionic type of memory devices according to embodiments of the present disclosure.

FIG. 6A is an illustration of a memory device 10 which includes a bottom electrode 16, which in turn is coupled to a base metal oxide layer 14 which in turn is coupled to a top electrode 12 which is made of a metal. An optional barrier layer (not shown) may be present between the base metal oxide layer 14 and the top electrode 12.

The Top electrode can be any metal, such as Platinum (Pt), Aluminum (Al), Ruthenium (Ru), Copper (Cu), Gold (Au), Tungsten (W), Titanium (Ti), Hafnium (Hf), Tantalum (Ta), Iridium (Ir), Zinc (Zn), Tin (Sn), Rhodium (Rh) and other metals. The Bottom electrode 16 may be Platinum (Pt), Aluminum (Al), Ruthenium (Ru), Copper (Cu), Gold (Au) or any other metal or conductive substrate.

The base metal oxide layer 14 can be one or more of Praseodymium Calcium Manganese Oxide (PCMO), Lanthanum Calcium Manganese Oxide (LCMO), Lanthanum Strontium Nickel Oxide (LSNO), Nickel Oxide ($Ni_xO_y$), Hafnium oxide ($Hf_xO_y$), Aluminum oxide ($Al_xO_y$), Tantalum oxide ($Ta_xO_y$) or any other metal oxide, metal nitride or metal oxynitride. The base metal oxide layer 14 may be a combination of more than one materials, phases or configurations of metal oxide. For example, the base metal oxide layer 14, itself, may be a layered material of one or more materials, phases, or configurations of metal oxides, metal nitride or metal oxynitride.

The barrier layer 20 may be one or more wide band gap material and/or low oxygen diffusion constant material such as Aluminum oxide ($Al_xO_y$), Hafnium oxide ($Hf_xO_y$), Nickel oxide ($Ni_xO_y$), Tantalum oxide ($Ta_xO_y$) or any other wide band gap material that has wider band gap than the metal oxide layer. The barrier layer 20 may be a combination of more than one materials, phases or configurations of wide band gap materials. For example, the barrier layer 20 may itself be a layered material of one or more materials, phases, or configurations exhibiting a characteristic of wide band gap compared to the metal oxide layer 14. The barrier layer may or may not be a metal oxide.

Figure 6B:
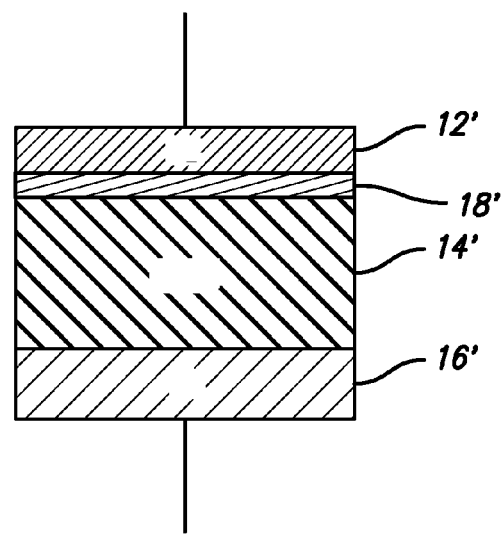

Referring now to FIG. 6B, if a Gibbs free energy of oxidation of the top electrode 12' is less (more negative) than a Gibbs free energy for the formation (oxidation) of the base metal oxide layer 14', the top electrode metal 12' may form a top metal oxide 18' at the interface with the base metal oxide layer 14'. If an optional barrier layer (not shown) is present between the top electrode metal 12 and the base metal oxide layer 14', then the top metal oxide 18' may form if the Gibbs free energy of oxidation of the top electrode 12' is less (more negative) than the Gibbs free energy of oxidation for the barrier layer.

This formation of the top metal oxide 18' may be spontaneous, as a result of externally applied electrical, chemical, thermal energy (potential), by deposition, or a combination of two or more methods described. The top metal oxide 18' of FIG. 6B may be formed in-situ or deposited by methods such as atomic layer deposition, chemical vapor deposition, physical vapor deposition, sputter, and others. The top metal oxide of FIG. 6B serves the same function as the metal oxide in FIG. 1. For deposited top metal oxide 18', the Gibbs free energy of oxidation for the top metal oxide 18' need not be less (more negative) than the Gibbs free energy of oxidation for the base metal oxide layer 14' or the Gibbs free energy of oxidation for the optional barrier layer.

The metal oxide layer 14' is preferably thicker than the top metal oxide layer 18'. In an embodiment, the metal oxide layer 14' is 10 to 100 times thicker than the top metal oxide layer 18'. For example, the thickness of the top metal oxide layer 18' may be in the range of 10 to 100 angstroms, and the thickness of the metal oxide layer 14 may be 100 to 10000 angstroms.

Figure 6C:
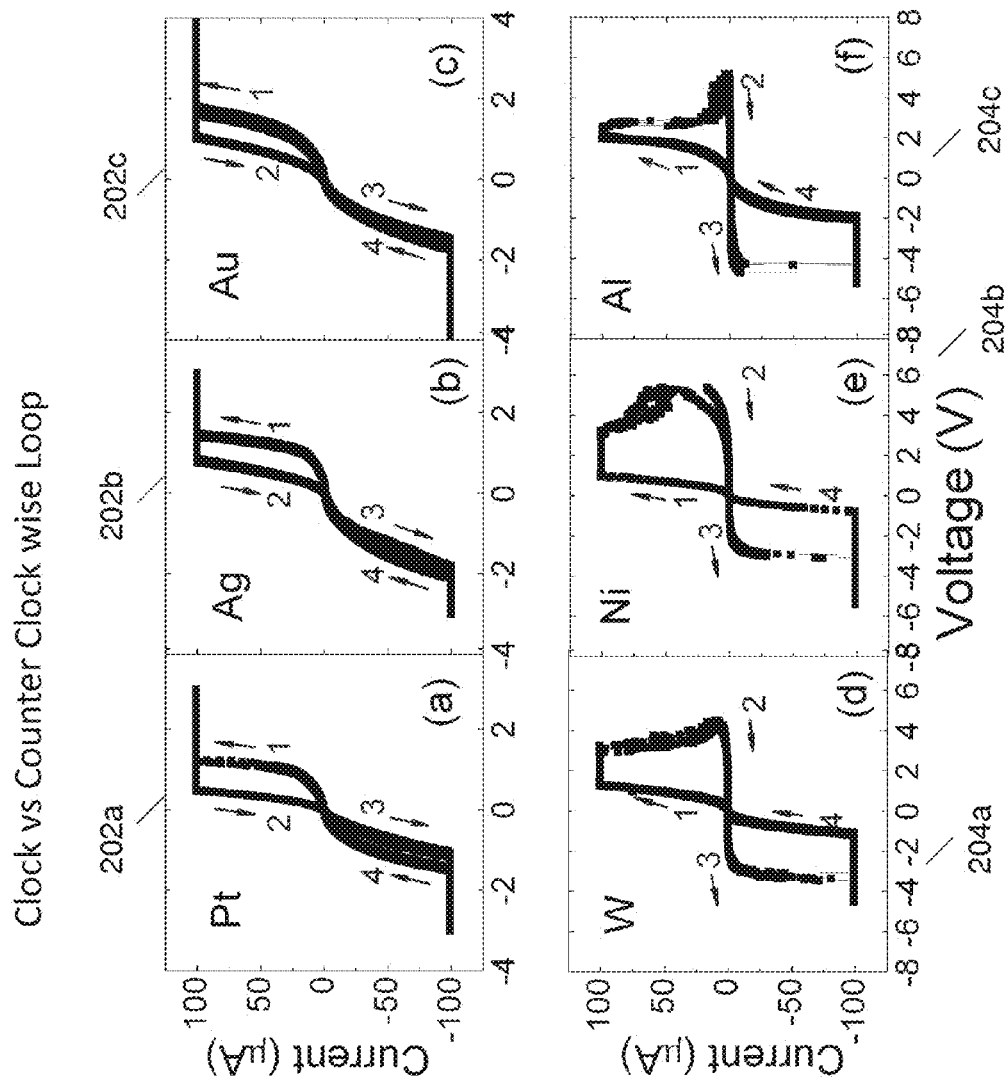

FIG. 6C shows several current-voltage (I-V) hysteresis curves for ionic type and vacancy type devices. As illustrated in curves 202a, 202b, and 202c, a ionic type device may yield a counter clock wise (CCW) hysteresis loop. However, as illustrated in curves 204a, 204b, and 204c, a vacancy type device may yield a clock wise hysteresis loop. Furthermore, the hysteresis loop of the vacancy type device may be considerably larger than the hysteresis loop of ionic type devices. The CCW loop and CW loop may be swapped if the polarity of the bias is interchanged. These unique I-V characteristics can be utilized for various applications. Devices using such I-V characteristics include but are not limited to memory devices, current switches, diodes, etc.

The different hysteresis loops shown in FIG. 6C illustrate that for vacancy type devices, base metal oxide 14 (e.g., PCMO) and top metal oxide 18 may each function as a switchable resistor. Thus, a voltage with the correct polarity and amplitude can cause either resistor to switch from a low resistive state (LRS) to a high resistive state (HRS) or from a HRS to a LRS.

In a particular embodiment, the switch from LRS to HRS is used to 'reset' the memory device and the transition from HRS to LRS is used to 'set' the memory device. In some embodiments, the lower oxidation Gibbs free energy of the top electrode in a vacancy type device may result in a more stable top oxide layer structure which has a higher resistance in HRS than the resistance of PCMO in HRS. For example, the top metal oxide layer maybe significantly thinner than PCMO and the resistance of the top metal oxide layer at LRS may be comparable to or lower than the resistance of PCMO at HRS. This feature maybe utilized in the following way.

When a vacancy type device containing a top metal oxide layer is in the HRS; most of the voltage applied to the vacancy type device will drop across the top metal oxide and hence create a high internal field that causes the switching from the HRS to the LRS ('set'). Many mechanisms for this switching are possible. For example, the internal field may push oxygen ions or vacancies through and out of the top metal oxide layer into the PCMO layer (i.e. base or bottom metal oxide layer), thus reducing the top metal oxide layer thickness. This movement of the oxygen ion or vacancy may be optionally through barrier layer 20.

On the other hand, when the vacancy type device is in the LRS, the voltage applied to the vacancy type device will be shared in the top metal oxide layer and in the PCMO layer or can be more in the PCMO layer. This allows field induced oxygen ion or vacancy migrations through and out of the PCMO layer into the top metal oxide layer and the top metal electrode layer. The influx of oxygen ions into the top metal oxide layer may cause further oxidation of the top metal electrode layer at the interface with the top metal oxide layer and may thus increase the thickness of the top metal oxide layer and cause the resistance of the device to switch from the LRS to the HRS ('reset').Again, this movement of the oxygen ion or vacancy out of the PCMO layer may optionally pass through barrier layer 20.

The relative layer thickness of the top metal oxide and the PCMO layers may be adjusted to secure desired levels of switching speed, switching potential, or both. These thickness adjustments may be produced by deposition condition changes and/or by depositing an initial top metal oxide layer before the deposition or the formation of top metal oxide layer 18.

Figure 16:
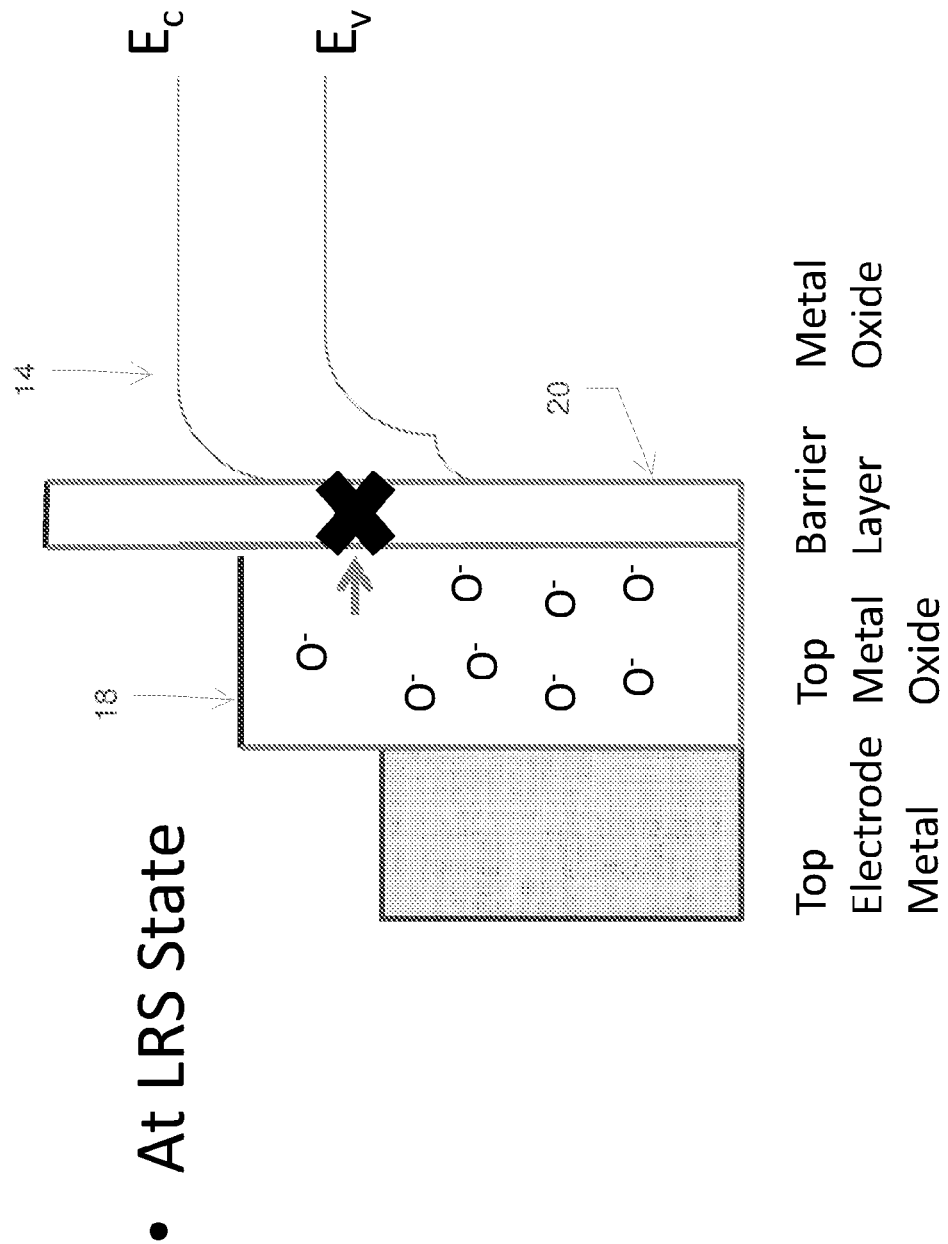
FIG. 16 is a diagram illustrating the energy levels in the metal oxide and the barrier layer's impact on the movement of oxygen ions according to an embodiment of the present invention.

In some embodiments, a barrier layer may be introduced between the PCMO layer and the top metal oxide layer. FIG. 16 illustrates a memory device structure according to another embodiment of the present invention. As illustrated in FIG. 16, a barrier layer 20 is present between PCMO layer 14 and top metal oxide layer 18. Barrier layer 20 can improve the stability of a vacancy type device. During the RESET operation, the applied external potential may cause oxygen ions or vacancies to migrate through and out of PCMO layer 14 into top metal oxide layer 18, which may result in an increase in the thickness of top metal oxide layer 18 and causes a switch from the LRS to the HRS. The resulting HRS state concentrates oxygen ions, whether bonded to top metal oxide layer 18 or freely moving, in top metal oxide layer 18. This concentration of oxygen ions sets up a built-in field which can result in a drift current of oxygen ions out of top metal oxide layer 18. Diffusion forces also tend to move oxygen ions from high concentration regions such as top metal oxide layer 18 to low concentration regions such as PCMO layer 14. These drift and diffusion forces are generally weaker than the applied external potential but when the applied external potential is removed, the drift and diffusion forces can result in deterioration of the HRS by reducing the effective thickness of top metal oxide layer 18.

Although FIG. 16 shows barrier layer 20 functioning to reduce oxygen ion movement in one resistance state, it is to be noted that barrier layer 20 can also reduce oxygen ion or vacancy movement in other resistance states. For example, in the LRS, it may be possible for drift and diffusion forces to result in a net migration of oxygen ions from PCMO layer 14 to top metal oxide layer 18 after the applied 'SET' external potential is removed. This migration can also result in the deterioration of the LRS state by increasing the effective thickness of top metal oxide layer 18. For some devices, the oxygen ion movement may be better described as oxygen vacancy movement, and it is to be noted that barrier layer 20 can also be said to reduce oxygen vacancy movement for the devices.

The deterioration of the separate resistance states HRS and LRS, such as by diffusion of oxygen ions, can result in difficulty in distinguishing the two states. When the vacancy type devices are used, for example, as memory devices, such deterioration erodes the ability to distinguish between the two resistance states and consequently deteriorates data retention capability of the memory device. Therefore a solution to this problem would be advantageous, e.g., in the utility of the vacancy type devices of the present disclosure as memory devices.

Barrier layer 20 described above can serve as a solution to the aforementioned problem of data retention. A barrier layer of wide band gap or an oxygen ion diffusion barrier material may serve to impede the drift and diffusion of the oxygen ions into or out of the top metal oxide layer thus improving the stability of the individual RHS and LHS states. This improvement can thus result in improvement in data retention of digital data written into arrays of the vacancy type devices of the present disclosure as distinct RHS and LHS states.

The barrier layer can further serve as a means for adjusting vacancy type devices in order to secure desired levels of switching speed, switching potential, or both. This adjustment may be useful in, for example, preventing early switching from occurring during voltage ramp up. For example, for the oxygen ions to diffuse through the barrier layer, a minimum voltage may be needed, thus preventing early switching of resistance states during switching. This may improve resistance switching uniformity. Barrier layer 20 may thus improve the uniformity of an array of many devices to achieve a narrow switching distribution. Such narrower switching distribution may result in better overall performance of the memory system. In some embodiments, it would be easier to distinguish between the LRS and the HRS bits in the array, thus requiring less overhead such as error correction and allow for faster response time.

Further such improved control as provided by the narrower switching distribution can be used to allow for multiple digital data bits to be stored in a single device by allowing for multiple resistance stages to be distinguished in every cell in an array. For example, if the LRS allows for 1 microamps (µA) of current to pass through the device at 1 Volt (V) of bias, and the HRS allows for 0.1 µA of current to pass through the device at 1 V of bias, then the window would be 1-0.1=0.9 µA. Then, if groups of devices, e.g., a sector of 1000 memory devices, were to be "read" and compared to a reference cell which allows 1 µA of current at 1 V of bias to determine the cells at LRS, the distribution of the currents for the 1000 memory devices influences whether it is easy to determine whether each device is in the LRS or the HRS. If the LRS currents are centered around 1 µA with an distribution of +/−0.5 µA (i.e. 0.5 µA to 1.5 µA) and the HRS currents are centered around 0.1 µA with a distribution of +/−0.5 µA (i.e., −0.4 µA to 0.6 µA), then the two distributions would overlap and there will be some devices for which it would be difficult to discern whether they are in the LRS or the HRS.

However, if the LRS currents are centered around 1 µA with a distribution of +/−0.1 µA (i.e. 0.9 µA to 1.1 µA) and the HRS currents are centered around 0.1 µA with a distribution of +/−0.1 µA (i.e. 0 µA to 0.3 µA), then the two distributions would be easily distinguishable and no devices would be in an ambiguous state. Further, additional states between the LRS and the HRS may be distinguishable. For example a middle resistance state (MRS) may be centered on 0.5 µA with a +/−0.1 µA distribution (i.e. 0.4 µA to 0.6 µA), and still be distinguishable from LRS and HRS devices as the distributions do not overlap. If 4 distinguishable states can be supported, then two bits of memory can be stored in a single device.

An embodiment of the present invention that includes a barrier layer provides a heterojunction memory device which can potentially retain data over a long period of time (e.g., 10+ years). The heterojunction memory device may be implemented in a variety of memory functions such as dynamic random access memory (DRAM), static random access memory (SRAM), one-time programmed memory (OTP), nonvolatile memory (NVM), embedded memory, cache memory, and others.

Figure 7A:
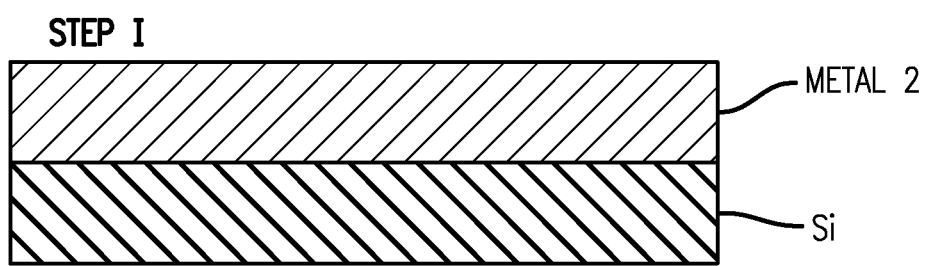
FIG. 7A illustrates providing the metal 2 on a silicon surface according to an embodiment of the present disclosure
Figure 7B:
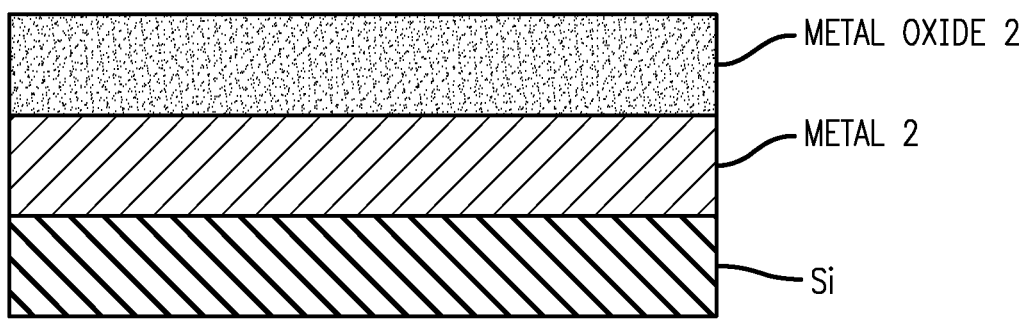
FIG. 7B illustrates depositing metal oxide 2 on the metal 2 surface according to an embodiment of the present disclosure.

FIGS. 7A-7D illustrates a process of producing the complementary heterojunction memory device of the present disclosure. FIG. 7A illustrates providing the metal 2 on a silicon surface. FIG. 7B illustrates depositing metal oxide 2 onto the metal 2 surface.

Figure 7C:
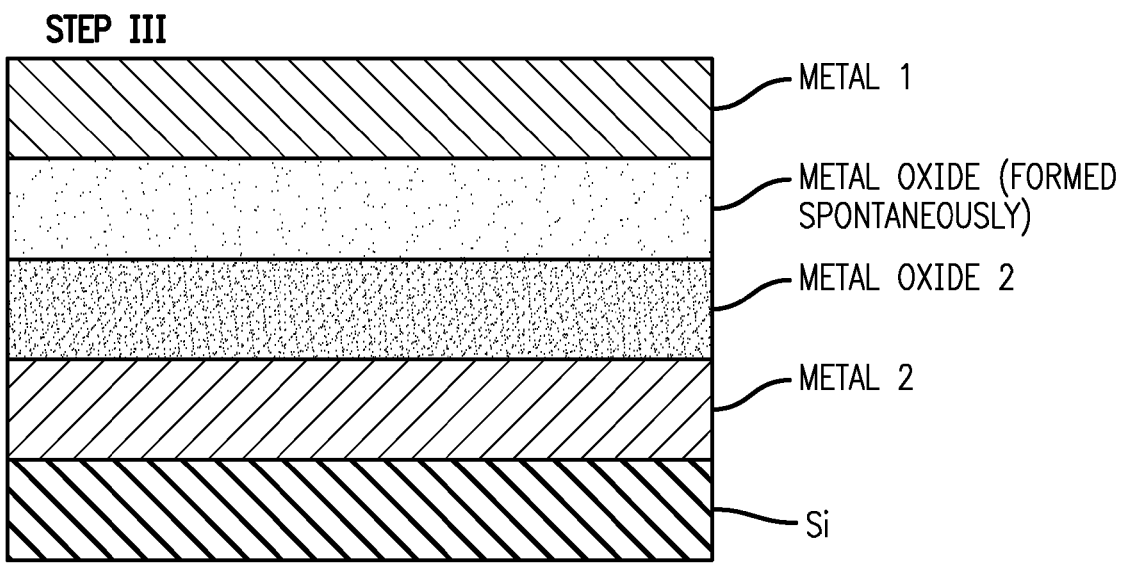
FIG. 7C illustrates a metal oxide 1 forming by providing a metal 1 of the appropriate Gibbs free energy of oxidation on the metal oxide 2, according to an embodiment of the present disclosure.
Figure 7C:
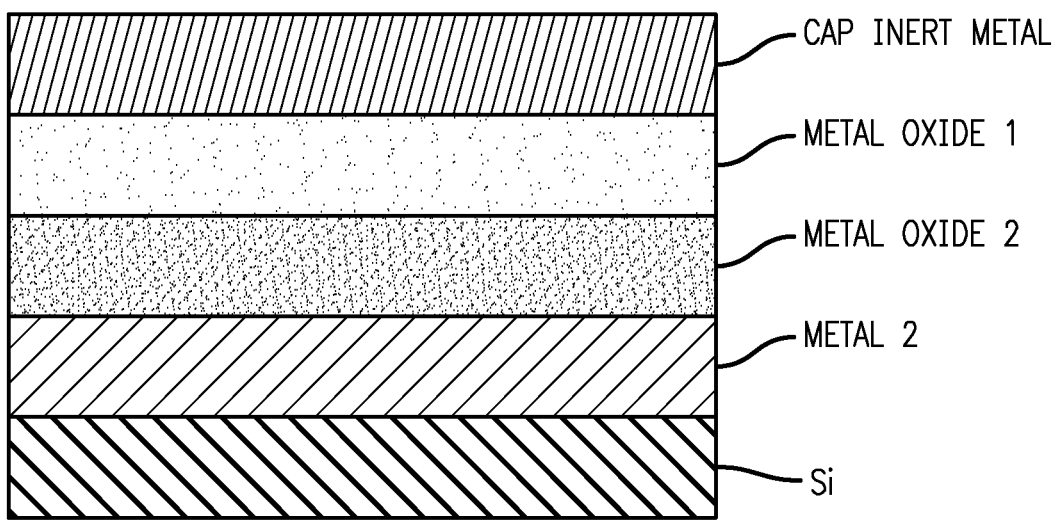

The following step is one of two alternative processes. Firstly, as seen in FIG. 7C, metal oxide 1 is formed spontaneously by providing metal 1 the metal oxide 2, where the metal 1 has a lower oxidation free energy than that of metal oxide 2 so that metal oxide 1 can be form between metal 1. The formation of the metal oxide 1 can be spontaneously occur due to oxidation free energy difference, or it can be induced by one of more of applied electrical potential, applied chemical potential, applied thermal energy or others.

For example, an applied electrical potential on the substrate during the providing of metal 1 may be used to change the oxygen content of the metal oxide 1. Similarly, a change in the surrounding oxygen content during the providing of metal 1 may change the chemical potential of the process thus changing the oxygen content of the metal oxide 1. Finally, thermal energy supplied by thermal heating or by localized laser heating AFTER the providing of metal 1 may increase the oxygen content of the metal oxide 1, especially if the oxygen content of the ambient is increased during the heating. Thus the oxygen content of the metal oxide 1 can be controlled to result in a vacancy state conduction memory device or an ionic state conduction memory device.

The second alternative method of providing metal oxide is shown in FIG. 7C' a metal oxide 1 is deposited on to the metal oxide 2 surface, and a separate metal 1 is provided on top of the metal oxide 1. The metal 1 may form a top electrode and it may be an inert metal. Through the use of this process, a complementary heterojunction oxide device can be provided that has memory characteristics that are significantly better than current art memory devices.

In particular, the deposition process for the metal oxide 1 can be tailored to form either a vacancy state conduction memory device or an ionic state conduction memory device by controlling the oxygen, nitrogen or both contents of the metal oxide 1 layer. For example, the oxygen content of the ambient can be reduced from stoichiometric levels during the deposition to form oxygen-deficient oxide or nitride for a vacancy state conduction device. Similarly, excess oxygen during deposition can be used to form oxygen-rich oxide for ionic state conduction device formation. The deposition process can be an atomic layer deposition, a chemical vapor deposition, a physical vapor deposition, sputtering, or other.

The heterojunction device with barrier layer of the present disclosure can function as a switchable resistor which can be used to construct high density memory array. Since heterojunction device is a bipolar device, in general, it may require a circuit with to operate (select, set, reset and read) individual device.

In a system in accordance with the present disclosure, back-to-back heterojunction resistive devices are utilized to eliminate the need of the transistor circuit. This type of memory system may use less power, and fewer processing steps than conventional memory systems. The device may allow for a method for forming a multi stack memory cell which may improve the cell density per unit source area.

Figure 8:
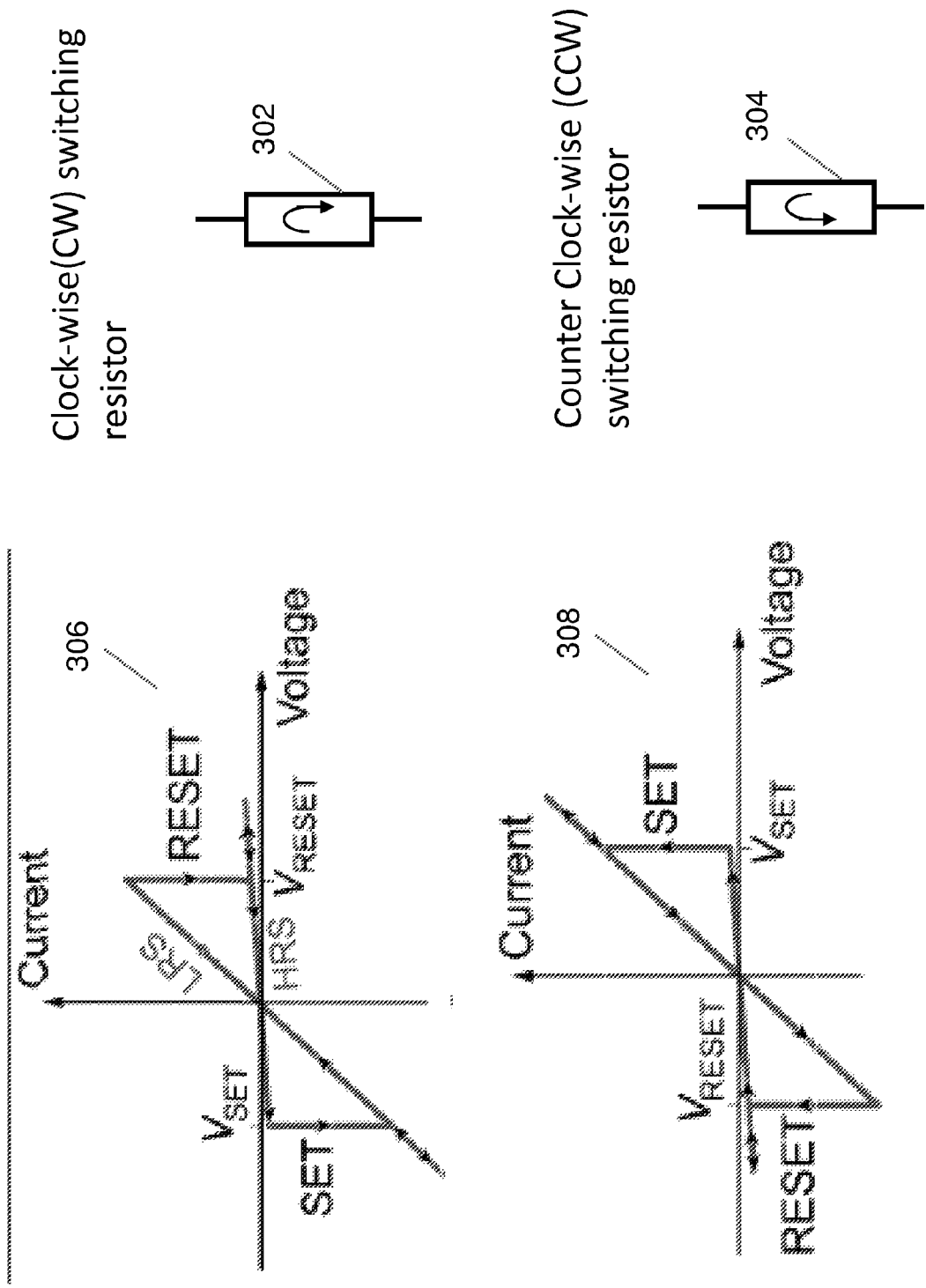
FIG. 8 illustrates the operation of a switchable resistor that has a clockwise hysteresis of current versus voltage and a switchable resistor that has a counter clockwise hysteresis of current to voltage.

FIG. 8 illustrates an embodiment of the present invention as a switchable resistor 302 that has an idealized clockwise hysteresis of current versus voltage (I-V) 306 and a switchable resistor 304 that has an idealized counter clockwise I-V hysteresis 308. CW and CCW switching resistors 302 and 304 can be ionic or vacancy device shown in FIG. 1. They can also be constructed by using the same type device with top and bottom electrode reversed. Although the idealized I-V characteristics to used to illustrate an embodiment of a switching resistor device, it is clear to one of ordinary skill in the art that a real device will have I-V curve that differs from the ideal ones used here. However, the principle remains valid even.

Figure 9:
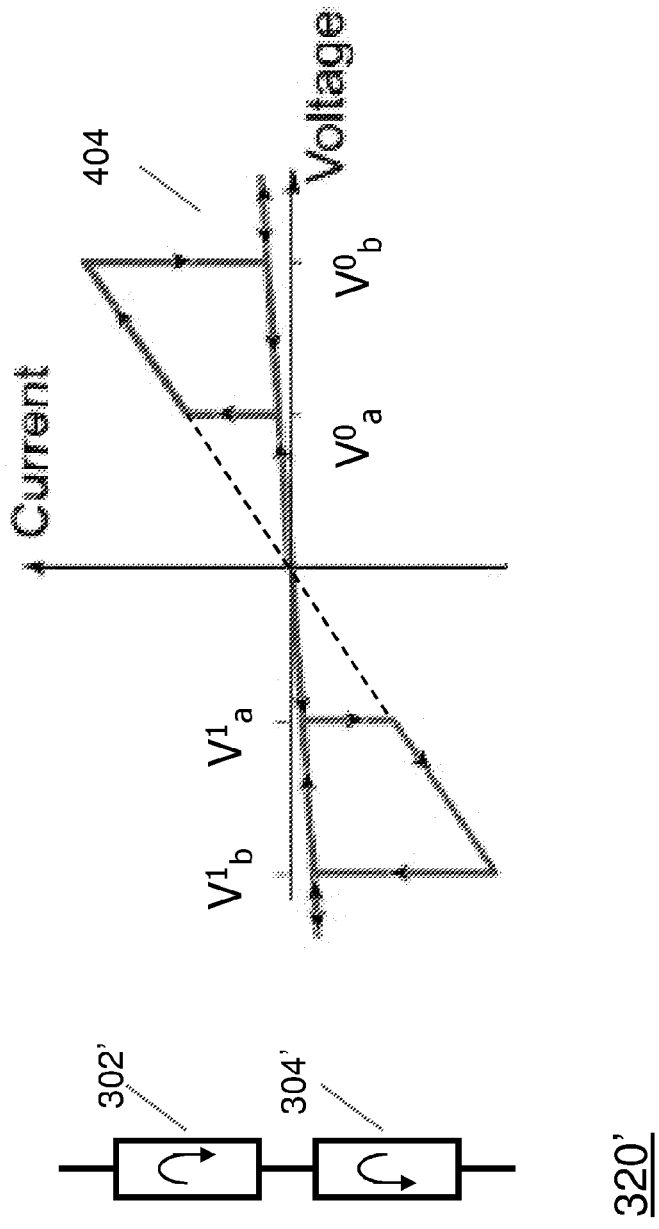
FIG. 9 is a diagram of a back to back switching resistor in accordance with an embodiment.

FIG. 9 is a diagram of a back to back switching device 320' according with an embodiment, as well as the I-V characteristics of such a combined device. These two resistors 302' and 304' have identical idealized I-V characteristics but with opposite polarities. The I-V characteristic is due to the fact that when one resistor is switching from HRS to LRS, the other resistor is switching from LRS to HRS. By using a switching voltage between the threshold voltages Va and Vb (with in positive side or negative side), both resistors 302' and 304' can be switched into LRS.

Figure 10:
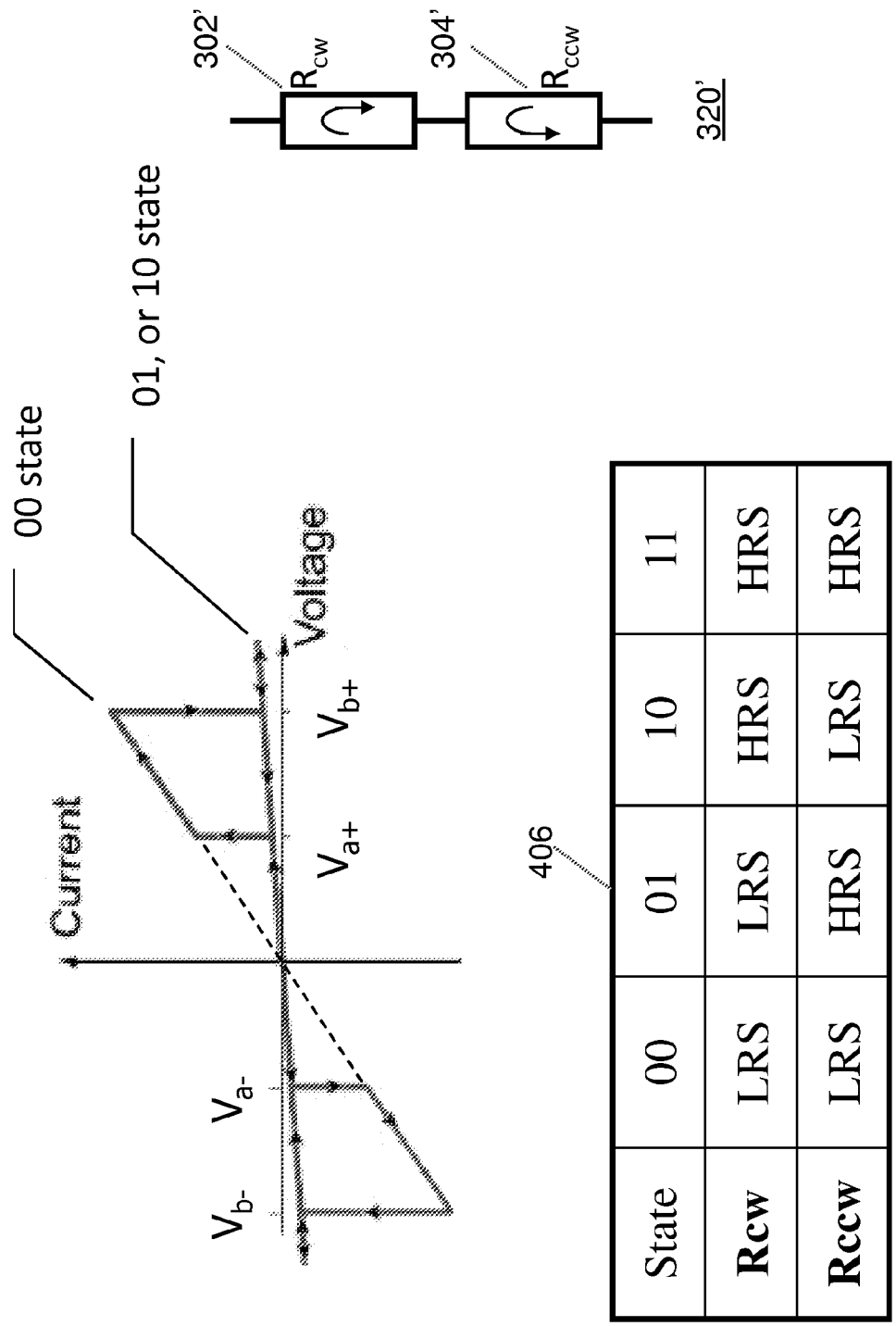
FIG. 10 is a diagram of the operation a tri-state back-to-back switching resistor device.

FIG. 10 shows that back-to-back switching device 320' can give rise to a tri-state. When either resistor 302' or 304' is in HRS, the device 320' is in HRS. So there are two HRS, the 01 or the 10 state. When both resistors are in LRS, the device is in LRS, or 00 state.

Figure 11:
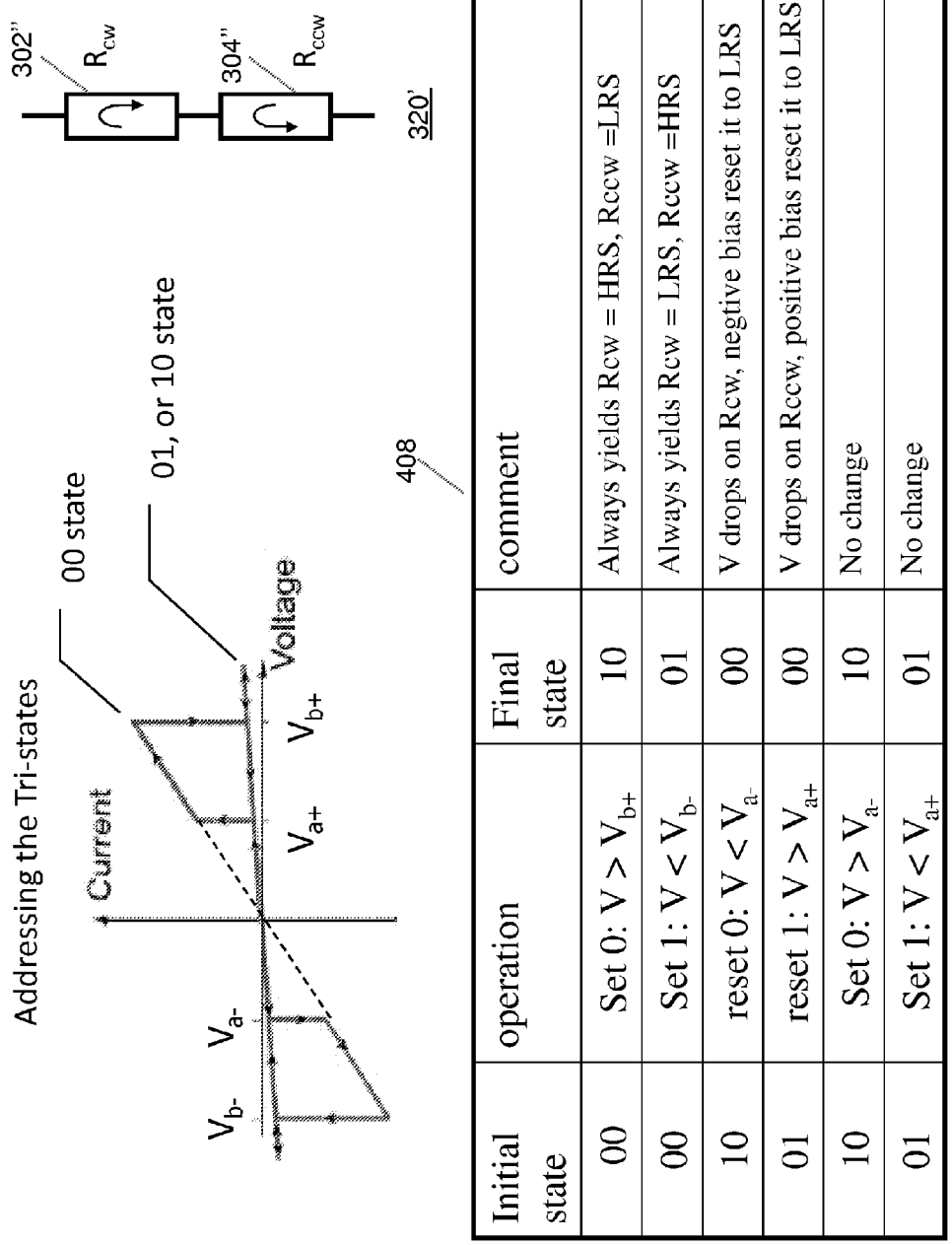
FIG. 11 illustrates first method for addressing the tri-states of the back to back switching device of FIG. 10.
Figure 12:
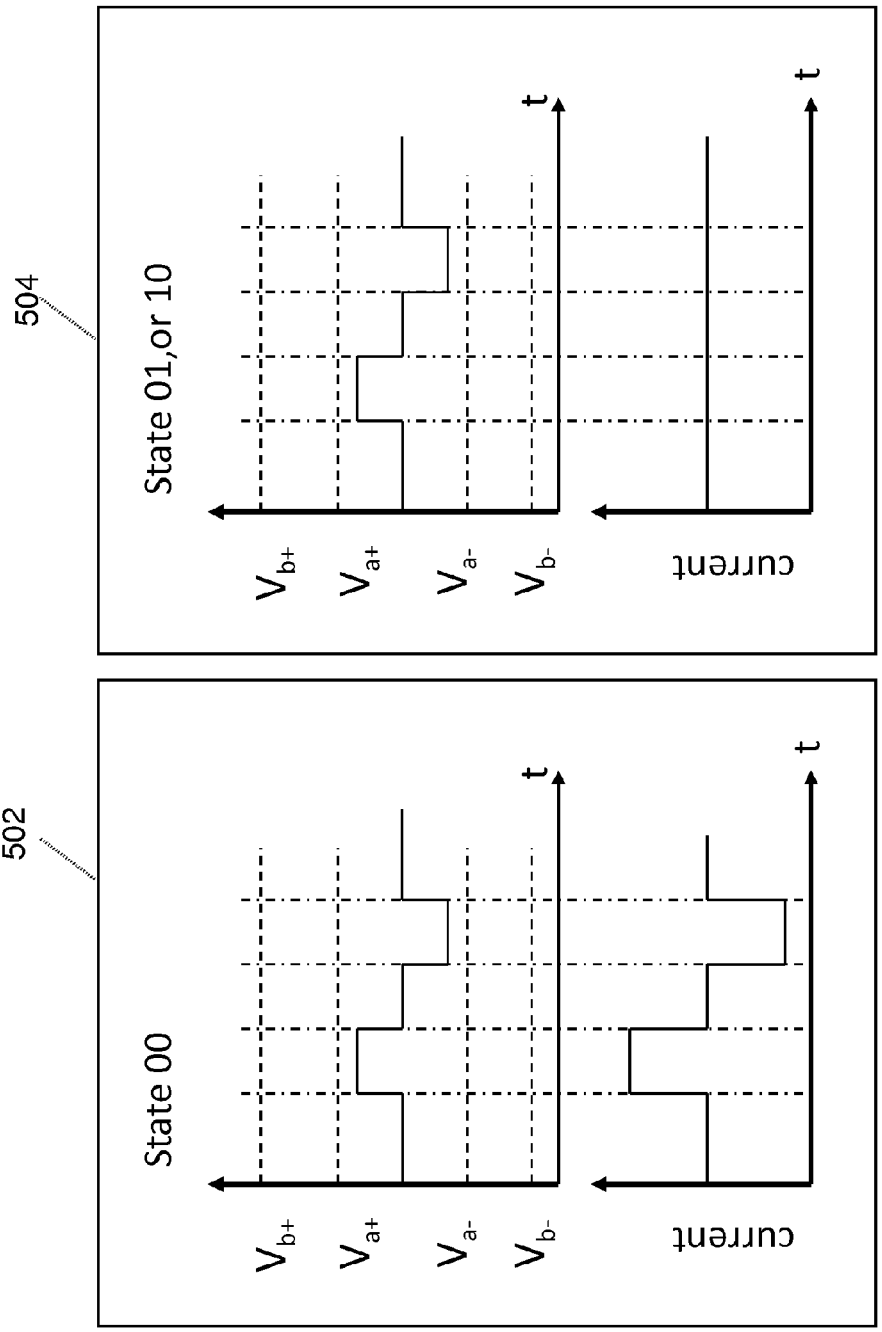
FIG. 12 is a diagram illustrating identifying the 00 state vs. 01, 10 state (nondestructive read).

The table 406 in FIG. 11 illustrates a method for addressing the tri-states of the back to back switching device 320' of FIG. 10. In general, 00 state can be set to 01 or 10 state and vice versa. FIG. 12 is a diagram illustrating a method to identify the 00 state 502 vs. 01, 10 state 504. Here the read voltage is within the two lower threshold voltage (Va−<V<Va+), therefore the device will remain in the original state. This is a nondestructive read.

Figure 13:
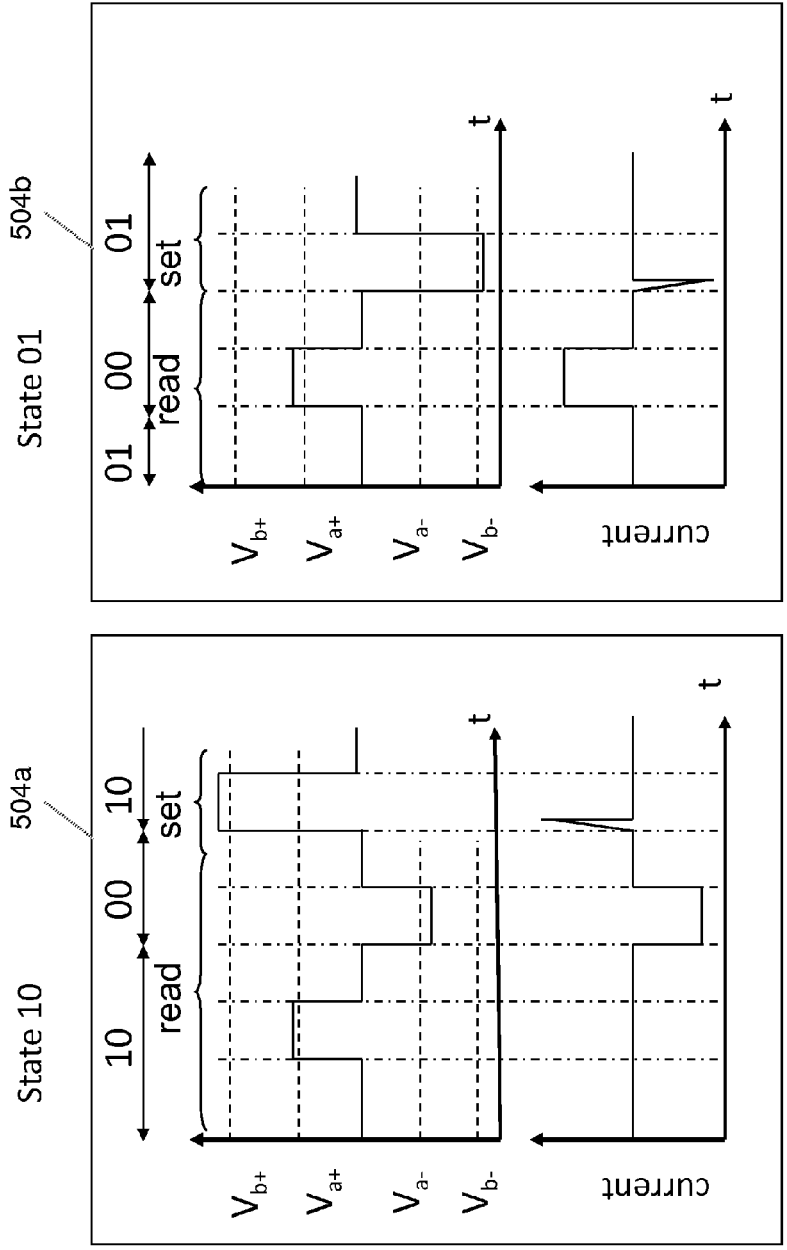
FIG. 13 is a diagram illustrating identifying a 10 state vs. 01 state (destructive read, need to reinstall the state after read).

The nondestructive read can only differentiate the 00 state (LRS) from either the 01 or 10 state (HRS state). To further differentiate 01 vs. 10 state, the polarity of the switching voltage (Vb−<V<Va− or Va+<V <Vb+) needs to be tested that cause the switching of HRS resistor to LRS. Since this is a destructive read, an additional pulse is needed to reset the device to the initial state before the destructive read. FIG. 13 is a diagram illustrating a method for identifying a 10 state vs. a 01 state. It is readily apparent to one of ordinary skill in the art that many other voltage pulses and sequences can be generated to read the tri-state.

The addressable and readable tri-state of a back-to-back switching resistor device can be used to create a memory array that avoid the need of an active transistor circuit to perform the select and set/reset and read. For example, since 01 and 10 states are two addressable and distinguishable HRS, they can be assigned to be the 0 or 1 state of a memory cell. Since both 0 and 1 state have high resistance, the system should have very low leakage current. A positive or negative voltage greater than Vb+ or smaller than Vb− can set the device to 1 or reset the device to 0 state as shown in the table for FIG. 11. For read operation, perform a test pulse to set the cell to 00 state and from the polarity of the bias to extract the 10 or 01 state. Note that the original state needs to be reinstalled after the read operation.

Figure 14:
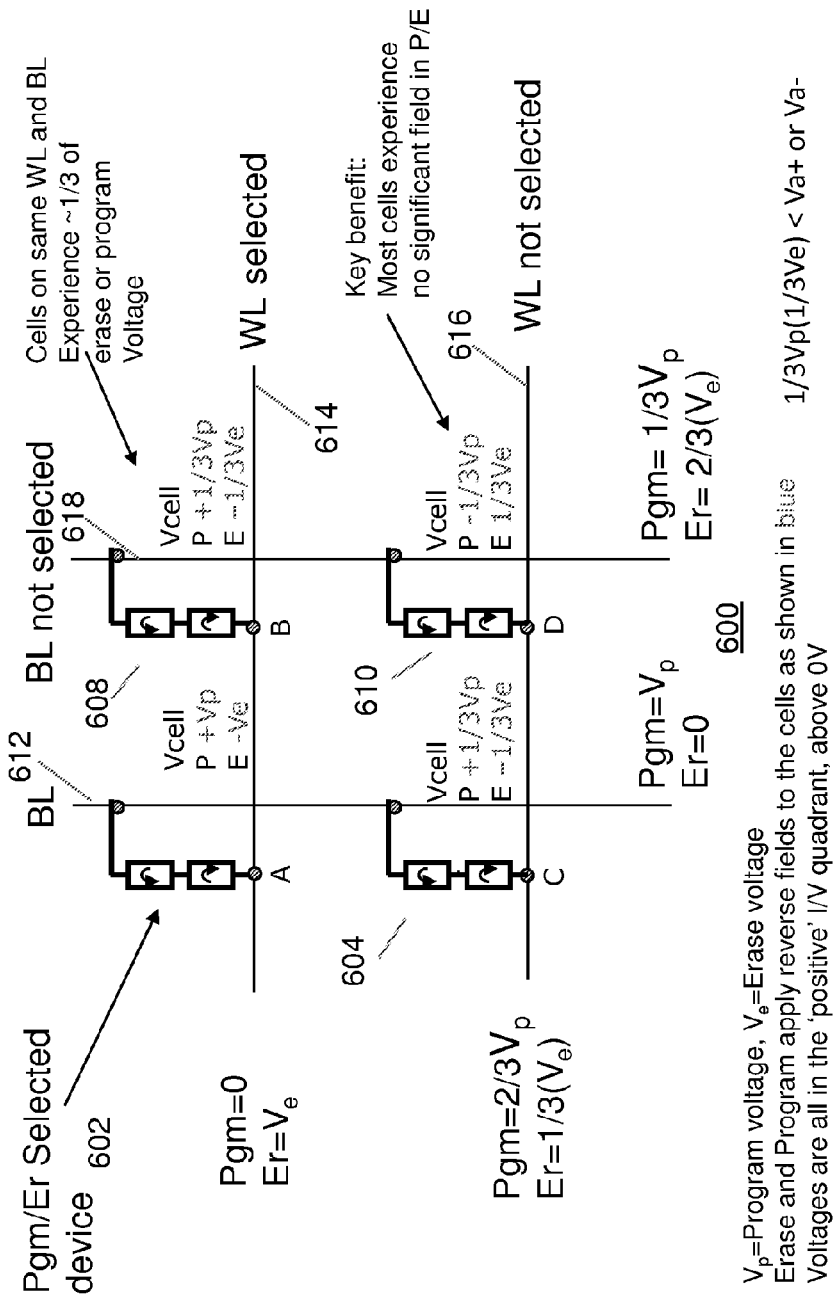
FIG. 14 illustrates addressing single cell of an array in accordance with an embodiment.

In order to address a particular memory cell, proper voltage on the read and write line are required so that the states of other cells in the memory array are not affected. FIG. 14 illustrates a diagram of biasing patterns that can fulfill this requirement when addressing single cell of an array in accordance with an embodiment.

Figure 15:
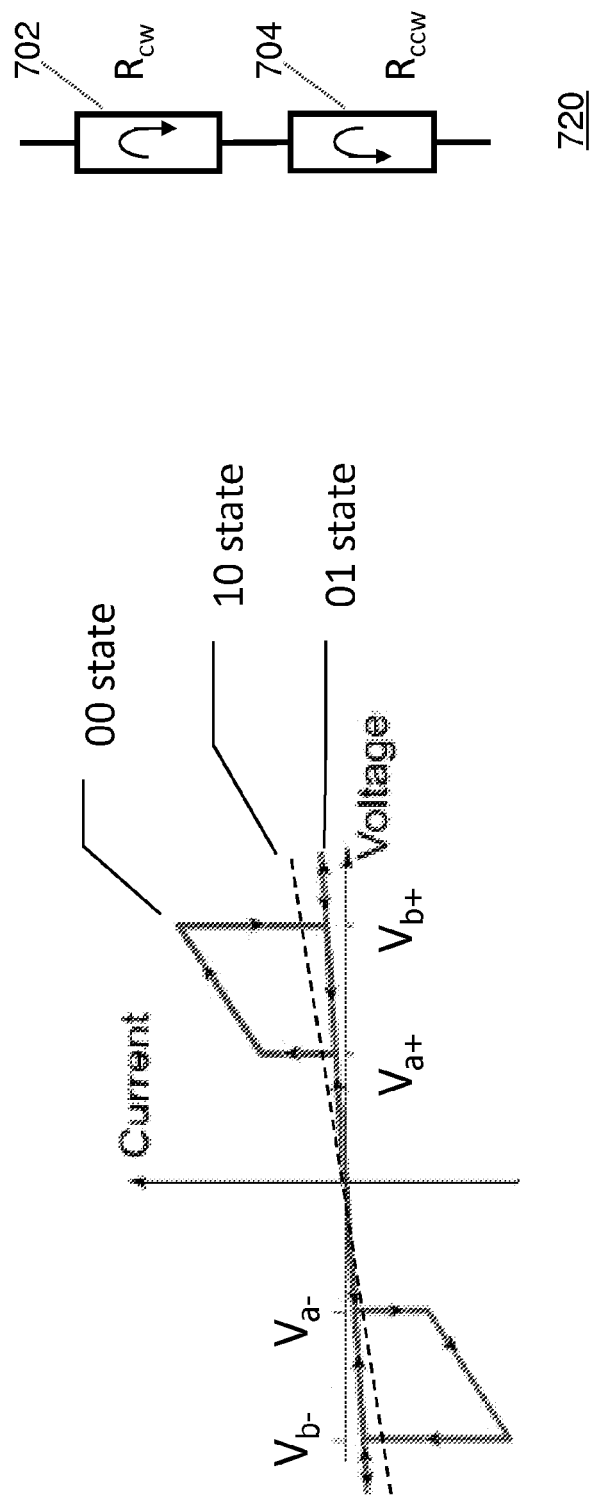
FIG. 15 illustrates creating asymmetry in the device to eliminate the need for resetting the device.

The above discussions are base on two identical heterojunction oxide resistors. If the HRS states of the two switching resistors 702 and 704 have sizable differences as illustrated in FIG. 15, than it is possible to perform a nondestructive read of a back-to-back resistor device. By so doing, we can eliminate the need for resetting the device after the read.

Although the present disclosure has been described in accordance with the embodiments shown, one of ordinary skill in the art will readily recognize that there could be variations to the embodiments and those variations would be within the spirit and scope of the present disclosure. Accordingly, many modifications may be made by one of ordinary skill in the art without departing from the spirit and scope of the appended claims.

What is claimed is:

1. A memory device, comprising:
a first metal layer;
a first metal oxide layer coupled to the first metal layer;
a second metal oxide layer coupled to the first metal oxide layer; and
a second metal layer coupled to the second metal oxide layer,
wherein the second metal oxide layer comprises:
a metal of the second metal layer, and
oxygen from the first metal oxide as a result of a Gibbs free energy for the formation of the first metal oxide layer being lower than the Gibbs free energy for the formation of the second metal oxide layer.

2. The memory device of claim 1, further comprising a barrier layer, coupled to the first metal oxide and wherein the second metal oxide layer is coupled to the barrier layer.

3. The memory device of claim 1, wherein an oxygen content of the second metal oxide is oxygen-rich.

4. The memory device of claim 1, wherein an oxygen content of the second metal oxide is oxygen-deficient.

5. The memory device of claim 1, wherein the first metal oxide layer has a first thickness that is three to one hundred times greater than a second thickness of the second metal oxide.

6. The memory device of claim 1 wherein the first metal oxide layer is characterized by a first state having a first resistance and a second state having a second resistance and the first metal oxide layer is characterized by a third state having a third resistance state and a fourth state having a fourth resistance, and wherein the first resistance is higher than the second resistance and the third resistance is higher than the fourth resistance.

7. A method of forming a memory device comprising:
providing a substrate having an upper surface and an opposing lower surface;
depositing a first metal layer over the upper surface of the substrate;
depositing a first metal oxide layer over the first metal layer; and
depositing a second metal layer over the second metal oxide layer, whereby a second metal oxide layer is spontaneously formed between the first metal oxide layer and the deposited second metal layer at least partly as a result of the second metal layer being deposited over the second metal oxide layer,
wherein the second metal oxide layer comprises a metal of the second metal layer.

8. The method of claim 7, further comprising adjusting an oxygen content of the second metal oxide layer to create an oxygen-rich second metal oxide layer.

9. The method of claim 7, further comprising adjusting an oxygen content of the second metal oxide layer to create an oxygen-deficient second metal oxide layer.

10. A method of forming a memory device comprising:
providing a substrate having an upper surface and an opposing lower surface;
depositing a first metal layer over the upper surface of the substrate;
depositing a first metal oxide layer over the first metal layer;
providing a barrier layer over the first metal oxide;
depositing a second metal layer over the second metal oxide layer, whereby a second metal oxide layer is spontaneously formed between the barrier layer and the deposited second metal layer at least partly as a result of the second metal layer being deposited over the barrier layer,
wherein the second metal oxide layer comprises a metal of the second metal layer.

11. The method of claim 10 wherein the barrier layer comprises a wide bandgap material including one of Aluminum oxide ($Al_xO_y$), Hafnium oxide ($Hf_xO_y$), Nickel oxide ($Ni_xO_y$), or Tantalum oxide ($Ta_xO_y$).

12. The method of claim 10, further comprising adjusting an oxygen content of the second metal oxide layer to create an oxygen-rich second metal oxide layer.

13. The method of claim 10, further comprising adjusting an oxygen content of the second metal oxide layer to create an oxygen-deficient second metal oxide layer.

* * * * *